(12) United States Patent
Reddy et al.

(10) Patent No.: US 8,686,889 B2
(45) Date of Patent: Apr. 1, 2014

(54) ANALOG FRONTEND FOR CCD/CIS SENSOR

(75) Inventors: Chandrashekar A. Reddy, Patancheru (IN); Yagneshwara Ramakrishna Rao Vadapalli, Hyderabad (IN)

(73) Assignee: Conexant Systems, Inc., Irvine, CA (US)

( * ) Notice: Subject to any disclaimer, the term of this patent is extended or adjusted under 35 U.S.C. 154(b) by 0 days.

(21) Appl. No.: 13/618,443

(22) Filed: Sep. 14, 2012

(65) Prior Publication Data

US 2013/0069808 A1 Mar. 21, 2013

Related U.S. Application Data

(60) Provisional application No. 61/535,740, filed on Sep. 16, 2011.

(51) Int. Cl.
*H03M 1/38* (2006.01)

(52) U.S. Cl.
USPC ............ 341/161; 327/56; 330/260; 330/261; 359/359; 250/208.1; 341/160; 341/163; 341/165

(58) Field of Classification Search
USPC ............ 341/140–172; 327/56; 330/260, 261; 359/359; 250/208.1
See application file for complete search history.

(56) References Cited

U.S. PATENT DOCUMENTS

| | | | | | |
|---|---|---|---|---|---|
| 4,622,536 | A * | 11/1986 | Shih et al. | ...................... | 341/108 |
| 6,304,207 | B1 * | 10/2001 | Lee | ............................... | 341/163 |
| 6,535,157 | B1 * | 3/2003 | Garrity et al. | .................. | 341/163 |
| 6,909,393 | B2 * | 6/2005 | Atriss et al. | .................... | 341/163 |
| 7,443,333 | B2 * | 10/2008 | Garrity et al. | .................. | 341/163 |
| 7,629,917 | B2 * | 12/2009 | Shinohara | ...................... | 341/172 |
| 7,929,204 | B2 * | 4/2011 | Lin | ............................... | 359/359 |
| 8,159,383 | B2 * | 4/2012 | Kumakura | ...................... | 341/162 |
| 8,264,393 | B2 * | 9/2012 | Garrity et al. | .................. | 341/163 |

OTHER PUBLICATIONS

Buckley, Kevin; Selecting an Analog Front-End for Imaging Applications; Analog Dialogue 34-6 (2000), 5 pages.

* cited by examiner

*Primary Examiner* — Lam T Mai
(74) *Attorney, Agent, or Firm* — Jackson Walker L.L.P.; Christopher J. Rourk

(57) ABSTRACT

A system for signal processing comprising a cyclic analog to digital converter structure having a first stage and a second stage, wherein the first stage is configured to receive an input signal to perform 1.5 bits/stage ADC and to generate a first stage output signal, and the second stage is configured to receive the first stage output signal and to perform fine offset tuning using a final conversion phase. The second stage further configured to perform 1.5 bits/stage ADC and to generate a second stage output that is fed back to the first stage to iteratively generate a next 1.5 bits, until (N−3) most significant bits of N bits of data are generated. A third stage configured to generate a three least significant bits of the N bits of data using a flash ADC sampling circuit that samples a residue signal at the output of the first stage.

20 Claims, 6 Drawing Sheets

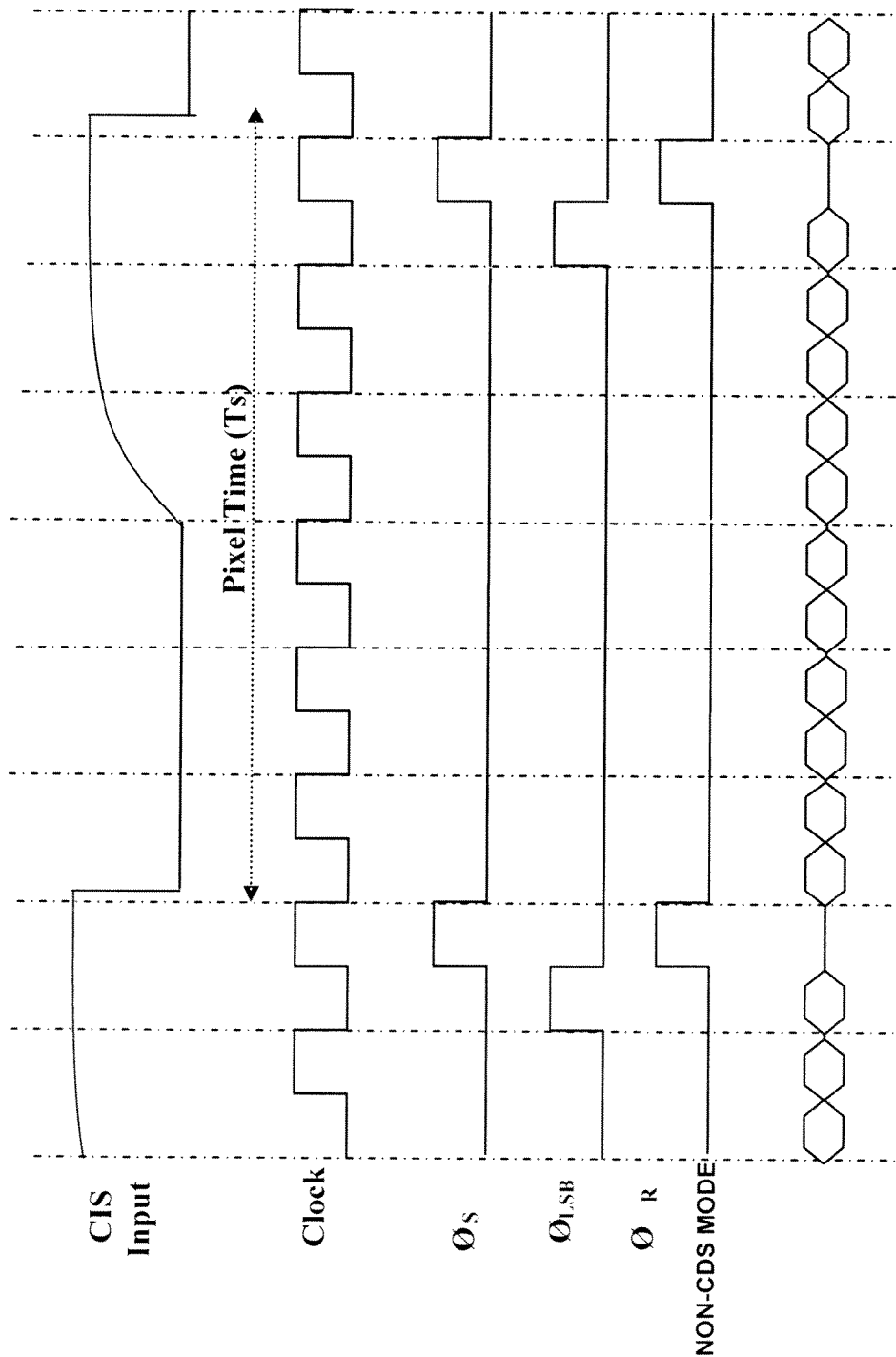

ANALOG FRONTEND FOR CCD/CIS SENSOR

RELATED APPLICATIONS

This application claims priority to U.S. Provisional patent application 61/535,740, filed Sep. 16, 2011, which is hereby incorporated by reference for all purposes.

TECHNICAL FIELD

The present disclosure relates generally to image data processing, and more specifically to an analog frontend for a charge coupled device (CCD) or contact image sensor (CIS), such as for scanner or multi-function printer (MFP) applications.

BACKGROUND OF THE INVENTION

CCD/CIS sensors typically generate analog data, which is then converted to digital data for further processing. Existing systems and methods for processing CCD/CIS sensor analog data require a large number of system components and consume a large amount of power.

SUMMARY OF THE INVENTION

A system for signal processing comprising a cyclic analog to digital converter structure having a first stage and a second stage, wherein the first stage is configured to sample an input signal, convert it from single ended to differential, apply coarse and fine offset and variable gain and to provide the output to a second stage to perform 1.5 bits/stage ADC. The second stage is further configured to perform 1.5 bits/stage ADC and to generate a second stage output that is fed back to the first stage to iteratively generate a next 1.5 bits, until (N−3) most significant bits of N bits of data are generated. A third stage configured to generate a three least significant bits of the N bits of data using a flash ADC sampling circuit that samples a residue signal at the output of the first stage. During the phase where flash ADC converts the first stage output to 3 bits output, the second stage is configured to generate a fine offset voltage to be sampled by the first input stage along with the next input sample.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views, and in which:

FIGS. 6 and 7 show exemplary timing diagrams of the present disclosure for CCD (CDS & non-CDS) and CIS input signaling.

DETAILED DESCRIPTION OF THE INVENTION

Figure 1:
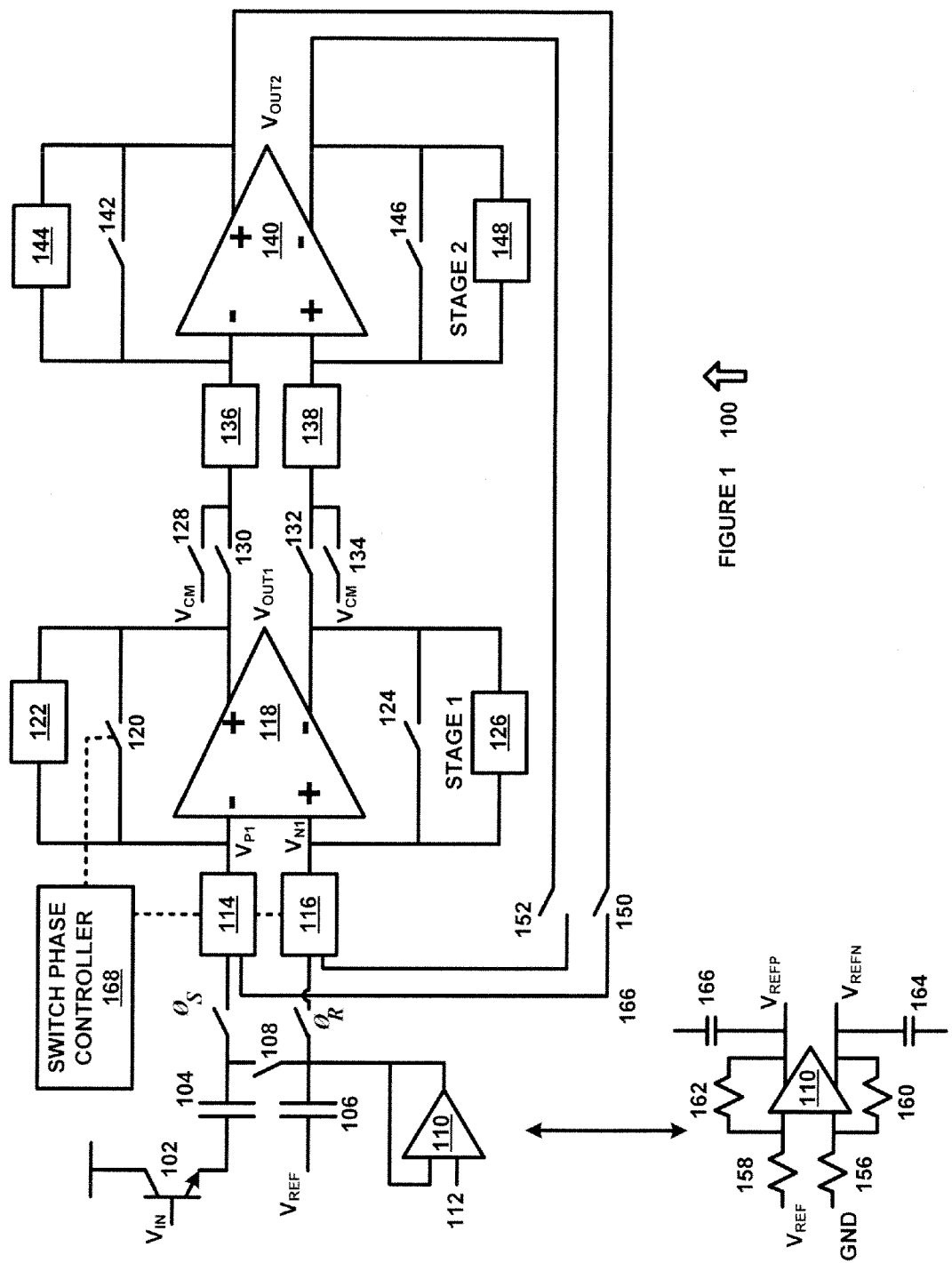
FIG. 1 is a diagram of a system for providing an AFE in accordance with an exemplary embodiment of the present disclosure.

In the description that follows, like parts are marked throughout the specification and drawings with the same reference numerals. The drawing figures might not be to scale and certain components can be shown in generalized or schematic form and identified by commercial designations in the interest of clarity and conciseness.

CCD/CIS sensors are widely used in imaging applications such as scanners, MFPs, cameras and medical imaging systems to capture image data. An array of sensors usually provide the data in the analog domain, which can be processed in the analog domain by an analog front end (AFE) before it is analyzed for further processing in digital domain.

For scanner/MFP applications, usually A/D converters with resolution more than 14 bits and sampling speed in excess of 6 MSPS are used.

Various image applications like scanning and MFPs can use high resolution (14 b or higher) analog front end for processing signals coming from a CCD or CIS. In order to keep the image integrity and to allow further processing of image data in the digital domain with high resolution, the AFE performs various functions like clamping, correlated double sampling (CDS), offset correction, gain and analog to digital conversion (ADC) with high resolution.

As all the above functions can directly add to/operate on the signal path, their device noise and settling errors should be less than 0.1 LSB of 14 bit ADC to achieve 14 bit performance. For example, even if the offset digital to analog conversion (DAC) is only 6 bit programmable, the DAC and rail to rail output buffer can be designed to have their device noise below 6 uV (1V reference), which means that these blocks may consume high power and area.

High resolution pipelined ADC implementations can use a high precision DAC, a low noise reference, high gain operational amplifiers, and/or a large input sampling capacitor (low KT/C noise and matching). In one exemplary embodiment, the disclosure includes an ADC implementation that takes advantage of high precision ADC sub-blocks and that implements offset DAC, single-ended to differential conversion, programmable gain amplification (PGA) and clamping. The disclosed architecture implements these features without adding any additional phases of operation but achieves these features by smart configuration of hardware in its unused phases of ADC operation. The disclosure can use a cyclic ADO structure instead of a pipelined ADC for lower area. The number of stages can be increased to increase the data rate. A 3 b flash ADC can be used to obtain the three least significant bits (LSBs). The first stage of the ADC can be used for sample/hold, offset correction, single ended to differential conversion and PGA functionality, and further fine offset tuning can be achieved using a second stage in the final phase of previous conversion when first stage residue output drives the 3 b flash ADC. In the next phase the second stage acts as a 1.5 bits/stage sub-ADC whose residue output is fed back to the 1st stage to generate next the 1.5 bits and so on, until (N−3) most significant bits (MSBs) of N bits are generated. The final 3 bits can be generated by the flash ADC sampling the residue at the output of the first stage.

By integrating the offset DAC as a part of the ADC stages, a high resolution APE can be designed with low power and area. Low area is important in order to provide an integrated solution that can go into a system on a chip (SOC). In cyclic ADCs, the total power is further minimized by dynamically scaling the amplifier current after each 1.5 bits conversion depending on the number of bits to be processed by the ADC. The ADC architecture takes advantage of high precision ADC sub-blocks to implement an offset DAC and PGA, that can be used for the CIS/CCD sensor AFE, thus reducing the additional area and power consuming hardware. As the same low noise, constant voltage ADC reference buffers are re-used to implement offset DAC, the rail to rail high speed and low noise output drivers are avoided. The present disclosure implements single-ended to differential conversion, offset DAC, PGA, CDS and clamping for the CIS/CCD sensor AFEs as part of the first stage of the ADC.

No additional amplifier needs to be used for sampling and single ended to differential conversion. Monotonicity can be used for the offset DAC to ensure that the control loop does not end up in undesired states. A high precision capacitor digital to analog converter (CDAC) of a cyclic ADC can be used to implement the offset DAC, so that monotonicity is ensured. Dynamic current scaling of the amplifier can be used based on the number of bits to be processed to minimize the total power consumption. An unused phase of the second stage can be used for to generate a fine offset voltage, such that additional offset DAC resolution can be obtained at no power cost. The pixel rate gain and offset corrections can be performed as related circuitry is integrated as part of the ADC. In certain cases, the clamp buffer can be implemented by using ADC positive reference to drive clamp reference, and which also saves additional pin and area.

An analog signal coming from a sensor usually lies in the range of 0 to 9 volts. This signal can be ac coupled before it is used for analog to digital (A/D) conversion, which can be performed using a clamping function in the sensor interface or other suitable functions. Black level offset correction or other suitable processing can be used to remove the offset from the signal so the dynamic range of the ADC can be fully utilized. A PGA or other suitable amplifiers can be used to amplify the input signal.

In addition to the above functions, a CCD sensor can use the CDS function in the AFE or other suitable functions to reduce the low frequency noise and offset coming from the sensor.

Most of the commercial sensors available today provide to 10 bit offset correction, but other suitable amounts of offset correction can also or alternatively be used. The offset DAC implementation can occupy a significant portion of the total area if large amounts of offset are used. If input multiplexing is used for the 3-channel (R-G-B) implementation, the offset DAC value can be changed for every input sample or in other suitable manners. In one exemplary embodiment, the system can operate at a sample speed, which places speed related requirements on the DAC implementation. In some of the exemplary 3-channel implementations, multiplexing can be done at the input of the ADC. Individual PGA and Offset DACs can be used for each channel, which relaxes some of the speed requirements but occupies a lot of area.

The PGA can be used to amplify the input signal so that dynamic range of the ADC can be fully utilized. An exemplary gain of the PGA generally lies in the range of 20 db to 35 db with 5 b to 9 b programmability depending on the application. Also, in some applications, the pixel rate gain and offset adjustment can be used to effectively utilize the dynamic range of the ADC.

In order to have minimal loss of image integrity and to do image processing and manipulation, ADC resolution higher than 14 b can be used. One specification of the CCD/CIS sensor AFEs is input referred noise. The speed of the AFE can be defined in dots per inch (dpi) and pages per minute (ppm) of the imaging system. For dpi of more than 600 and 5 ppm requirements, a sample speed of 12 MHz can be used. To get 10 ppm, sampling speeds in excess of 20 MHz can be used. For high end scanners where true bit performance is used, noise requirements can be very stringent. For example, true 14 b AFE can use noise levels that are below 0.1 LSB, which translates to less than 6 µV (for 1 V reference).

An AFE generally has a clamping buffer, PGA amplifier, DAC for offset correction and S/H amplifier for single ended to differential ended amplifier and sampling functions. Once the signal is processed through above functions, it is digitized by the ADC. The ADC resolution will determine the noise specifications for the above mentioned features. The higher the ADC resolution, the more stringent the noise specification for these sub-blocks will be. A high resolution pipelined ADC implementation can require a high precision DAC, a low noise reference, high gain operational amplifiers and large input sampling capacitor (low KT/C noise and matching).

One exemplary embodiment of the disclosure modifies the ADC implementation to take advantage of already existing high precision ADC sub-blocks to implement the aforementioned features. This new architecture implements these features without adding any additional phases of operation but achieves these by smart re-configuration of hardware in unused phases during ADC operation. Offset correction of the DAC is implemented in a novel way by integrating it as a part of the ADC block without using any additional DAC and reference voltages. A 2 stage cyclic ADC structure can be chosen over a pipelined ADC to lower the area. Additional stages can be used to increase the data rate. A 3 b flash ADC can be used to obtain the 3 LSBs.

FIG. 1 is a diagram of a system 100 for providing an AFE in accordance with an exemplary embodiment of the present disclosure. System 100 can be implemented in hardware or a suitable combination of hardware and software.

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications or on two or more processors, or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections.

System 100 includes an input buffer 102 that receives an input voltage, and a reference voltage. The first stage of system 100 is used for sample/hold, offset correction, single ended to differential conversion and PGA functionality, and further fine offset tuning can be achieved using a second stage in the final phase of the previous conversion, while the first stage residue output can be used to drive a 3 bit flash ADC. In the next phase, the second stage acts as 1.5 bits/stage sub-ADC whose residue output is fed back to the first stage to generate the next 1.5 bits and so on, until (N−3) MSBs of N bits are generated. The final 3 bits are generated by the flash ADC sampling the residue at the output of the first stage.

By integrating the offset DAC as a part of the ADC stages, most of the AFE noise can also be reduced. In an algorithmic ADC, the total power is further minimized by dynamically scaling the amplifier current after each 1.5 bits conversion depending on the number of bits to be processed by ADC.

The ADC architecture takes advantage of high precision ADC sub-blocks to implement an offset DAC and a PGA that can be used for the CIS/CCD sensor AFE, which reduces the additional area and power hungry hardware.

As the same low noise, constant voltage ADC reference buffers are re-used to implement offset DAC, rail to rail high speed and low noise output drivers are avoided.

The architecture implements single-ended to differential conversion, CDS and clamping required for the CIS/CCD sensor AFEs as part of the first stage of the ADC.

No additional amplifier is used for sampling and single ended to differential conversion.

Monotonicity can be used for the offset DAC to ensure that the control loop does not end up in undesired states. A high precision CDAC of cyclic ADC has been used to implement the offset DAC, so that monotonicity is ensured.

Dynamic current scaling of the amplifier is accomplished based on the number of bits to be processed, to minimize the total power consumption.

An unused phase of the second stage can be used to generate a fine offset voltage, such that additional offset DAC resolution is obtained at no power cost.

Pixel rate gain and offset corrections can be accomplished using circuitry that is integrated as part of the ADC.

In certain cases, clamp buffer 110 can be implemented by using an ADC positive reference to drive the clamp reference voltage, to save additional pin and area. An exemplary embodiment of the disclosure includes a 2 stage cyclic ADC. Each stage of the ADC can include sample and hold, ADC, DAC and a gain stage. DAC of each stage can be implemented using a unit capacitor array. Capacitors 104 and 106 are used to couple the common-mode level of the image sensor's output signal, which can range from 0 V to more than 9 V. The input clamp restores the dc level of the signal to an optimum point within the supply range of the AFE. In some applications, the clamp buffer can be avoided by using $V_{REFP}$ as the clamp reference, or the exemplary embodiment shown using resistors 156, 158, 160 and 162 and capacitors 164 and 166 can be used with clamp buffer 110 to provide a reference buffer with external capacitance for low noise.

A sample switch $\phi_S$ and reset switch $\phi_R$ are used to sample the input to CDACs 114 and 116, which also apply M MSBs of offset voltage to the input during a hold phase. After the input signal is offset corrected, it is amplified to the selected level by using PGA 122 and PGA 126. The PGAs can be implemented by using a programmable capacitor in a feedback loop of amplifier 118. Instead of single stage, the PGA can be implemented in two stages to ease the performance requirements of amplifier 118. Switches 120 and 124 are closed during the sample phase and open during the hold (amplifying) phase. Switches 130 and 132 are closed during the second stage phase, and are otherwise open. Switches 128 and 134 are closed during the LSB phase, and are otherwise open. CDACs 136 and 138 provide the offset for K LSBs, and amplifier 140 of stage 2 operates in conjunction with PGA 144 and PGA 148 in the same manner as stage 1. Switches 142 and 146 are closed during the second stage sample phase and are otherwise open. Switches 150 and 152 are closed during the ADC mode sample phase of the first stage and are otherwise open.

Switch phase controller 168 can be implemented in hardware or a suitable combination of hardware and software, and is coupled to all phase operated switches (exemplary connections to switches 114, 116 and 120 are shown). The operation of switch phase controller 168 is further described herein.

Figure 2:
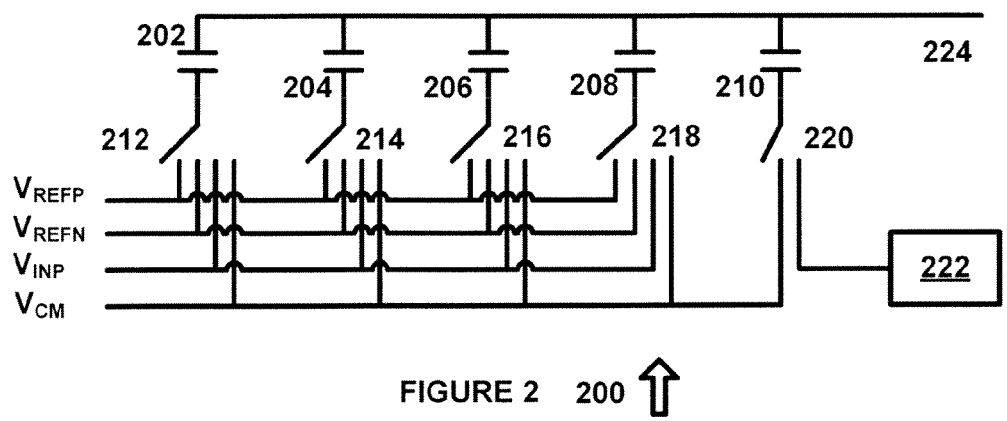
FIG. 2 is a diagram of a system for providing a six bit offset correction DAC using three bit DAC in stage 1 and three bit DAC in stage 2 in accordance with an exemplary embodiment of the present disclosure.

FIG. 2 is a diagram of a system 200 for providing a six bit offset correction DAC using three bit DAC in stage 1 and three bit DAC in stage 2 in accordance with an exemplary embodiment of the present disclosure. Switches 212, 214, 216, 218 and 220 are controlled by MSB offset reference code to switch between $V_{REFP}$, $V_{REFN}$, $V_{INP}$ and $V_{CM}$. In one exemplary embodiment, capacitor 202 can have a relative capacitance value of C/2, capacitor 204 can have a relative capacitance value of C/4, capacitor 206 can have a relative capacitance value of C/8, capacitor 208 can have a relative capacitance value of C/8 and capacitor 210 can have a relative capacitance value of C/8. Likewise, other suitable capacitance values can also or alternatively be selected. LSB DAC 220 receives an LSB offset code and outputs an offset value from stage 2. Output 224 provides the current value for $V_{P1}$ or $V_{N1}$, depending on the phase of operation.

In operation, a signal coming from the sensor is sampled by the CDAC capacitors 202, 204, 206 and 208 during the input sampling phase ($\Phi s$ & $\Phi R$). At the same time, the fine offset voltage coming from second stage is also sampled on to capacitor 210. In general, a pipelined ADC uses the CDAC (sometimes called a multiplying DAC) which is formed with one or more capacitors, depending on the number of bits per stage required. In this exemplary embodiment, the sample capacitor is split to provide an M bit DAC which is used for performing offset correction in addition to the sampling function.

When the first stage changes from the sampling phase to the hold phase (which is also the amplifying phase), some of the CDAC capacitors are switched to the reference voltages, depending on the MSB offset code. This operation subtracts (or adds) the offset voltage from the sampled voltage in addition to normal hold operation.

During the same hold phase, the offset corrected signal is amplified by the capacitors 122 and 126 of system 100, depending on the PGA code. Once the signal is offset corrected and gain multiplied, normal cyclic ADC operation is performed to get 1.5 b per stage.

The fine offset voltage is provided by the second stage when cyclic ADC operation is completed and second stage is ready for sampling again, such as one half cycle before the input is sampled again.

Figure 3:
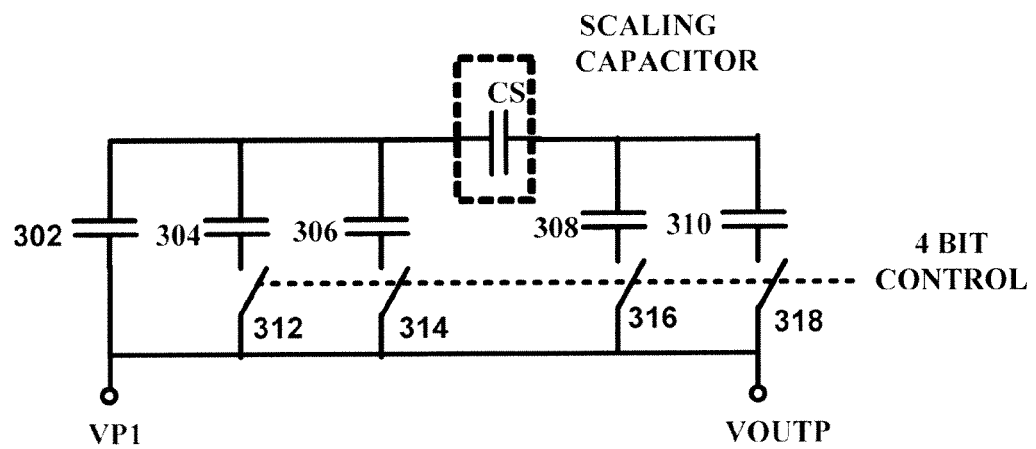
FIG. 3 is a diagram of a system for providing a programmable gain amplifier in accordance with an exemplary embodiment of the present disclosure.

FIG. 3 is a diagram of a system 300 for providing a programmable gain amplifier in accordance with an exemplary embodiment of the present disclosure. System 300 can be used to implement PGA 122, 126, 144, 148 or other suitable PGAs.

System 300 includes a scaling capacitor $C_S$ which is coupled to capacitors 302, 304, 306, 308 and 310. A four bit control signal controls the configuration of switches 312, 314, 316 and 318, which are used to control the value of VOUTP based on the value of VP1 (or VN1, depending on the application of system 300). The values of capacitors 302, 304, 306, 308 and 310 can be C/4, C/4, C/2, C/4 and C/2, respectively, or other suitable values. By using the split capacitor architecture, fine steps in gain control can be achieved.

Figure 4:
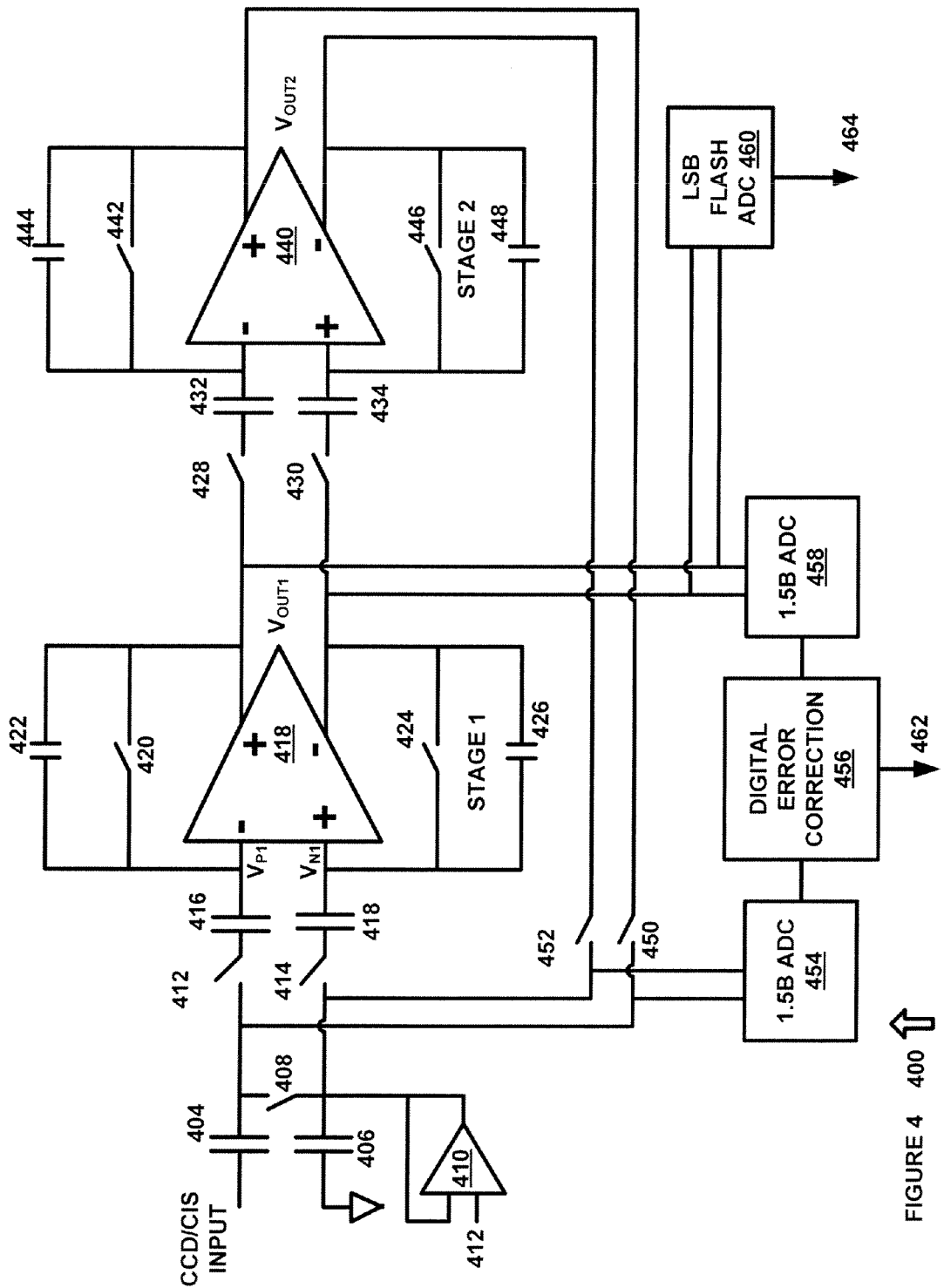
FIG. 4 is a diagram of system for providing an AFE in accordance with an exemplary embodiment of the present disclosure.

FIG. 4 is a diagram of system 400 for providing an AFE in accordance with an exemplary embodiment of the present disclosure. System 400 can be implemented in hardware or a suitable combination of hardware and software.

System 400 is similar to system 100, and includes clamp buffer 410, clamp switch 408, clamp capacitors 404 and 406. Sample phase switch 412 and reset phase 414 samples the input to capacitors 416 and 418, which can be implemented as CDACs or in other suitable manners. Amplifier 418 of stage 1 is coupled to sample phase switches 420 and 424 and to capacitors 422 and 426, which can be implemented as capacitor switched PGAs or in other suitable manners. The output of amplifier 418 is coupled to 1.5 bit ADC 458, to LSB flash ADC 460 and to switches 428 and 430. Likewise, amplifier 440 is coupled to input capacitors 432 and 434, which can be implemented as CDACs or in other suitable manners, and to sample phase switches 442 and 446 and to capacitors 444 and 448, which can be implemented as capacitor switched PGAs or in other suitable manners. The output of amplifier 440 is coupled to phase switches 450 and 452, which control the connection to 1.5 bit ADC 454. The outputs of 1.5 bit ADCs 454 and 458 are coupled to digital error correction 456, which outputs the M MSBs for the ADC. Likewise, LSB flash ADC 460 outputs the K LSBs for the ADC.

Figure 5:
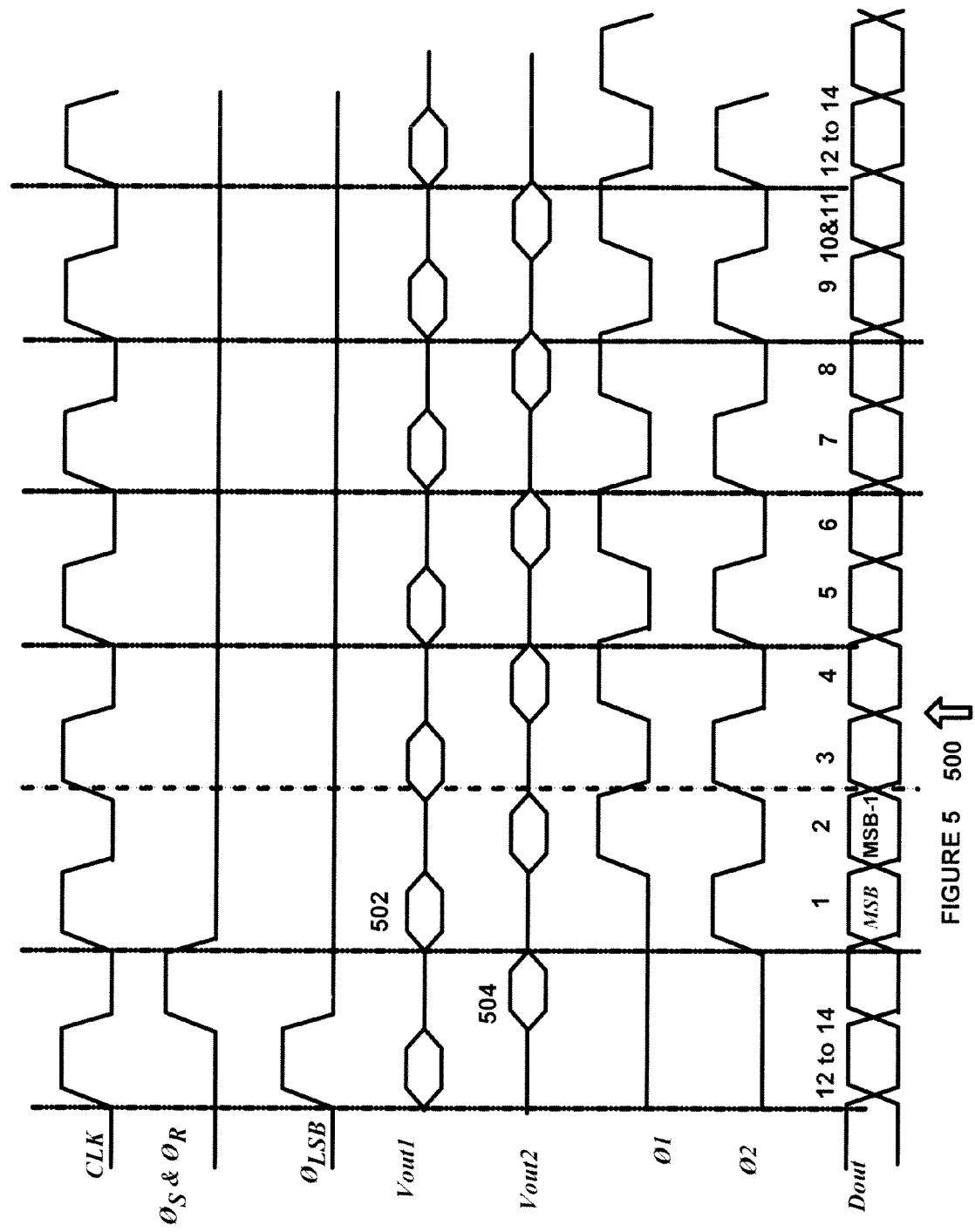
FIG. 5 is a timing diagram in accordance with an exemplary embodiment of the present disclosure.

FIG. 5 is a timing diagram 500 in accordance with an exemplary embodiment of the present disclosure. Timing diagram 500 can be implemented using switch phase controller 168 or in other suitable manners. During the sampling phase $Ø_S$, the input is sampled on the input DAC in stage 1, and the value of $V_{OUT1}$ at 502 equals $(V_{IN}-V_{OFFSET})$*PGA. At the same time, the output of stage 2 provides the LSB offset value at 504, which is also sampled on to the unit capacitor. During offset correction of phase Ø2 (depending on the MSB offset code), the input DAC is switched to the respective references. This operation subtracts (or adds) the offset value to the input sampled value. During the same phase depending on the PGA code, an offset corrected output is amplified (or attenuated) by the feedback capacitor in Stage 1.

Once the input signal is offset corrected and amplified, it can be used for normal ADC operation. Stage 2 takes the input available from stage 1 and starts the cyclic ADC operation. To minimize the total number cycles for conversion and also to effectively use the unused phase, 3 bit flash ADC is used to get the last 3 LSBs.

In the case of a CCD input signal, a black level reference value can be sampled during the reset phase of the CCD signal by using the phase ØR which sampled the reference value on to the one of the unused capacitors during the ADC operation, as the ADC stage only requires a single input capacitor for sample and hold and gain.

Figure 6:
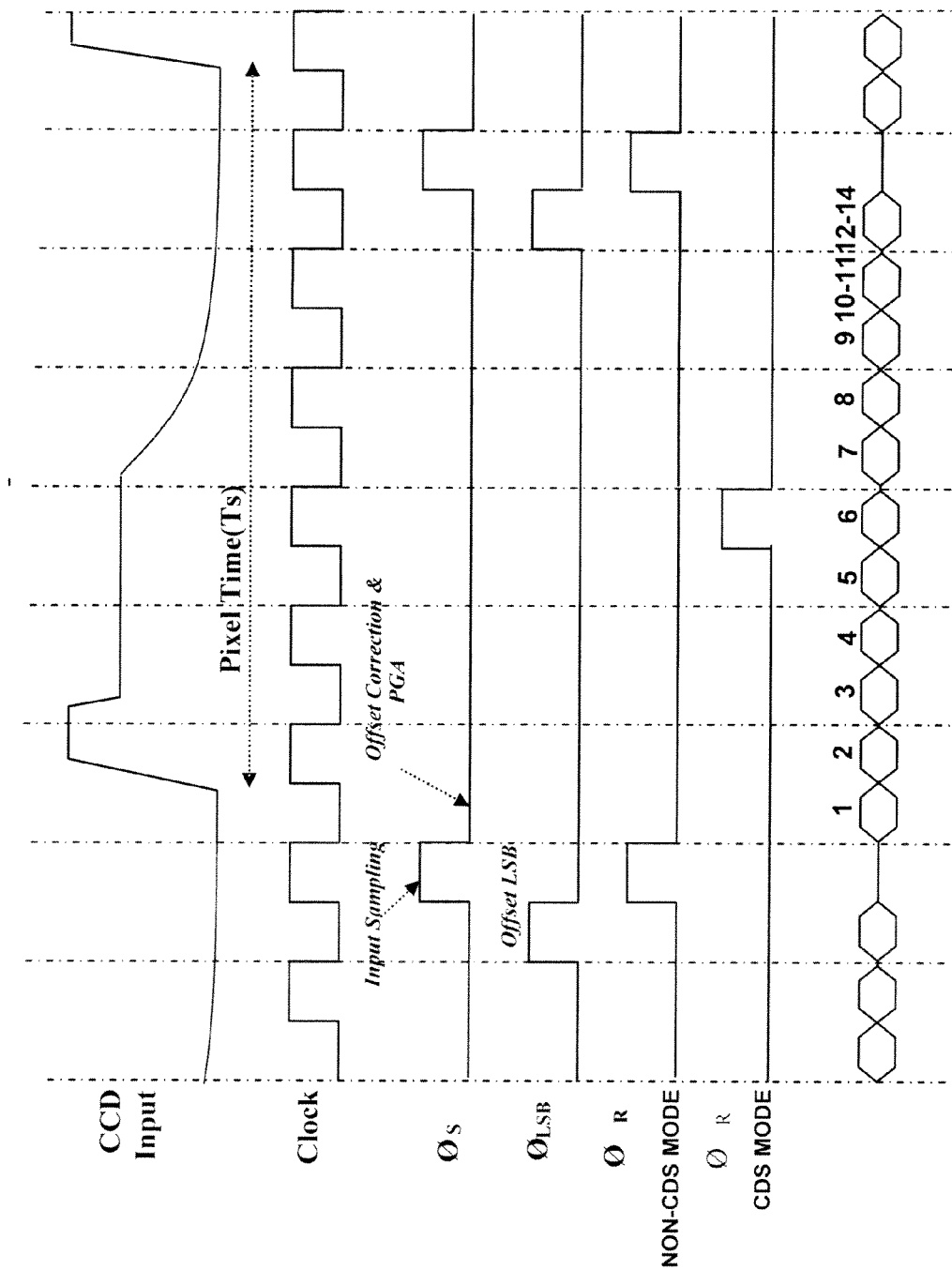

FIGS. 6 AND 7 show exemplary timing diagrams 600 and 700 of the present disclosure for CCD (CDS & non-CDS) and CIS input signaling, respectively. Timing diagrams 600 and 700 can be implemented using switch phase controller 168 or in other suitable manners. In the case of a CIS sensor input, the clamping circuit can be disabled and the sensor can directly connect to the input without a clamping capacitor.

For input sampling in CDS mode, the input voltage $V_{IN}$ is sampled on to the sample capacitor during phase ØS and is subtracted from the reset voltage sampled on to the reset capacitor during the reset phase ØR, such that $V_{OUT1}$ equals $V_{IN}$ minus $V_{RESET}$ for CCD mode operation. For non-CDS mode operation, the input voltage $V_{IN}$ is subtracted from the clamp voltage $V_{CLAMP}$ during phase ØS, such that $V_{OUT1}$ equals $V_{IN}$ minus $V_{CLAMP}$ for CCD operation and $V_{OUT1}$ equals $V_{IN}$ for CIS operation.

After sampling the input on to the sample and reset capacitors, the offset value is subtracted from $V_{OUT1}$ and amplified by the PGA, such that $V_{OUT2}$ equals $(V_{OUT1}-V_{OFFSET})$*PGA. The ADC code equals $V_{OUT2}$ times $2^N/V_{REF}$.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A system for signal processing comprising:
a cyclic analog to digital converter (ADC) structure having a first stage and a second stage, wherein the first stage is configured to receive an input signal to perform 1.5 bits/stage ADC and to generate a first stage output signal, and the second stage is configured to receive the first stage output signal and to perform fine offset tuning using a final conversion phase;
the second stage further configured to perform 1.5 bits/stage ADC and to generate a second stage output that is fed back to the first stage to iteratively generate a next 1.5 bits, until (N−3) most significant bits (MSBs) of N bits of data are generated; and
a third stage configured to generate a three least significant bits (LSBs) of the N bits of data using a flash ADC sampling circuit that samples a residue signal at the output of the first stage.

2. The system of claim 1 further comprising a clamp buffer coupled to the input, the clamp buffer configured to limit an amplitude of the input signal to a predetermined maximum amplitude.

3. The system of claim 1 wherein the first stage further comprises a capacitor digital to analog converter (CDAC) configured to receive the input signal and to perform offset correction processing.

4. The system of claim 1 wherein the CDAC comprises:
a first four position switch having a $V_{REFP}$ input, a $V_{REFN}$ input, a $V_{CM}$ input and a $V_{INP}$ input; and
a first capacitor selectively coupled to one of the $V_{REFP}$ input, the $V_{REFN}$ input, the $V_{CM}$ input and the $V_{INP}$ input of the first four position switch and an output of the CDAC.

5. The system of claim 4 wherein the CDAC comprises:
one or more additional four position switches, each having a $V_{REFP}$ input, a $V_{REFN}$ input, a $V_{CM}$ input and a $V_{INP}$ input; and
one or more additional capacitors, each selectively coupled to one of the $V_{REFP}$ input, the $V_{REFN}$ input, the $V_{CM}$ input and the $V_{INP}$ input of one of the additional four position switches and an output of the CDAC.

6. The system of claim 1 wherein the first stage further comprises a programmable gain amplifier (PGA) configured to receive the input and to perform programmable gain amplification processing.

7. The system of claim 3 wherein the first stage further comprises a programmable gain amplifier (PGA) coupled to the CDAC and configured to receive an output of the CDAC and to perform the programmable gain amplification processing on the output of the CDAC.

8. The system of claim 6 wherein the PGA comprises:
a scaling capacitor;

a first capacitor having a first end coupled to the input and a second end coupled to the scaling capacitor; and a plurality of additional capacitors, each having a first end coupled to a first end of one of a corresponding plurality of switches and a second end coupled to the scaling capacitor, wherein each of the plurality of switches each has a second end coupled to the input and a control terminal configured to receive a control signal and to open or close in response to the control signal.

9. A system for signal processing comprising:

a first phase operated switch coupled to an input;

a second phase operated switch coupled to a reference voltage;

a first capacitor digital to analog converter (CDAC) coupled to the first phase operated switch;

a second CDAC coupled to the second phase operated switch;

an amplifier having a first input coupled to an output of the of the first CDAC and a second input coupled to an output of the second CDAC;

a third phase operated switch coupled between a first output of the amplifier and the first input of the amplifier;

a first programmable gain amplifier (PGA) coupled between the first output of the amplifier and the first input of the amplifier;

a fourth phase operated switch coupled between a second output of the amplifier and the second input of the amplifier;

a second PGA coupled between the second output of the amplifier and the second input of the amplifier; and a controller configured to operate the first phase operated switch and the second phase operated switch in a first phase, and the third phase operated switch and the fourth phase operated switch in a second phase that is different from the first phase.

10. The system of claim 9 further comprising an analog to digital converter coupled to the first phase operated switch and the second phase operated switch.

11. The system of claim 9 further comprising an analog to digital converter coupled to the first output of the amplifier and the second output of the amplifier.

12. The system of claim 11 further comprising a flash analog to digital converter coupled to the first output of the amplifier and the second output of the amplifier.

13. The system of claim 9 further comprising:

a fifth phase operated switch coupled to the first output of the amplifier and a third CDAC;

a sixth phase operated switch coupled to the second output of the amplifier and a fourth CDAC; and the controller configured to operate the fifth phase operated switch and the sixth phase operated switch in a third phase that is different from the first phase and the second phase.

14. The system of claim 13 further comprising a second amplifier having a first input coupled to an output of the third CDAC and a second input coupled to an output of the fourth CDAC.

15. The system of claim 14 further comprising a seventh phase operated switch coupled between an output of the second amplifier and the first input of the second amplifier.

16. The system of claim 14 further comprising:

a seventh phase operated switch coupled between a first output of the second amplifier and the first input of the second amplifier; and an eighth phase operated switch coupled between a second output of the second amplifier and the second input of the second amplifier.

17. The system of claim 14 further comprising:

a seventh phase operated switch coupled between a first output of the second amplifier and the first input of the second amplifier;

an eighth phase operated switch coupled between a second output of the second amplifier and the second input of the second amplifier; and the controller configured to operate the seventh phase operated switch and the eighth phase operated switch in the third phase.

18. The system of claim 14 further comprising a third PGA coupled between an output of the second amplifier and the first input of the second amplifier.

19. The system of claim 14 further comprising:

a third PGA coupled between a first output of the second amplifier and the first input of the second amplifier; and a fourth PGA coupled between a second output of the second amplifier and the second input of the second amplifier.

20. The system of claim 13 further comprising:

a seventh phase operated switch coupled between a first output of the second amplifier and the first CDAC; and an eighth phase operated switch coupled between a second output of the second amplifier and the second CDAC.

* * * * *